(12) United States Patent
Chang et al.

(10) Patent No.: US 8,846,149 B2
(45) Date of Patent: Sep. 30, 2014

(54) DELAMINATION RESISTANT SEMICONDUCTOR FILM AND METHOD FOR FORMING THE SAME

(75) Inventors: Yuh-Hwa Chang, Shulin (TW); Ming-Tai Chung, Hsinchu (TW); Jui-Chun Weng, Taipei (TW); Ming-Yi Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 2257 days.

(21) Appl. No.: 11/358,650

(22) Filed: Feb. 21, 2006

(65) Prior Publication Data
US 2007/0197005 A1 Aug. 23, 2007

(51) Int. Cl.
| | | |
|---|---|---|
| *B05D 1/36* | (2006.01) | |
| *B05D 3/00* | (2006.01) | |
| *B81C 1/00* | (2006.01) | |
| *H01L 31/0352* | (2006.01) | |

(52) U.S. Cl.
CPC ...... *H01L 31/035272* (2013.01); *B81C 1/0038* (2013.01); *B05D 1/36* (2013.01)
USPC ............................ 427/264; 427/270; 427/271

(58) Field of Classification Search
None
See application file for complete search history.

(56) References Cited

U.S. PATENT DOCUMENTS

| | | | | |
|---|---|---|---|---|
| 4,741,964 A | * | 5/1988 | Haller ............................ | 428/446 |
| 4,776,896 A | * | 10/1988 | Umemoto ..................... | 136/256 |
| 5,449,640 A | * | 9/1995 | Hunt et al. .................... | 438/640 |
| 5,656,547 A | * | 8/1997 | Richards et al. .............. | 438/460 |
| 5,681,616 A | * | 10/1997 | Gupta et al. ................... | 427/264 |
| 6,194,249 B1 | * | 2/2001 | Chen et al. ..................... | 438/115 |
| 6,534,396 B1 | * | 3/2003 | Fahn et al. ..................... | 438/632 |
| 6,586,347 B1 | * | 7/2003 | Liu et al. ....................... | 438/778 |
| 7,696,101 B2 | * | 4/2010 | Li ................................... | 438/736 |
| 2001/0006846 A1 | * | 7/2001 | Cao et al. ...................... | 438/618 |
| 2001/0038367 A1 | * | 11/2001 | Inukai .............................. | 345/76 |
| 2002/0011598 A1 | * | 1/2002 | Yamazaki et al. .............. | 257/72 |
| 2002/0016073 A1 | * | 2/2002 | Kondo et al. .................. | 438/691 |
| 2003/0006468 A1 | * | 1/2003 | Ma et al. ........................ | 257/416 |
| 2003/0040195 A1 | * | 2/2003 | Chang et al. .................. | 438/782 |
| 2003/0124462 A1 | * | 7/2003 | Miller ............................ | 430/311 |
| 2003/0151020 A1 | * | 8/2003 | Lee et al. ........................... | 252/2 |

(Continued)

FOREIGN PATENT DOCUMENTS

| | | | | |
|---|---|---|---|---|
| JP | 62062050 | * | 3/1987 | .............. H01L 21/20 |
| JP | 2058322 | | 2/1990 | |

OTHER PUBLICATIONS

Cerofolini et al "Hydrogen related complexes as the stressing species in high fluence hydrogen implanted single crystal silicon" Jul. 15, 1992 Physical Rev. B vol. 46 No. 4.*

(Continued)

*Primary Examiner* — Mandy Louie
(74) *Attorney, Agent, or Firm* — Duane Morris LLP

(57) ABSTRACT

A method and structure for preventing film delamination provide for forming a thick film then partitioning the thick film into a plurality of discrete portions prior to subsequent thermal processing operations. The partitioning alleviates the effects of film stress at the interface between the film and the underlying material and prevents delamination during the subsequent thermal cycling operations, that take place subsequent to the formation of the film. The partitioned film includes a pattern density of at least about 80 percent and the discrete portions do not individually serve as device structures.

13 Claims, 4 Drawing Sheets

(56) References Cited

U.S. PATENT DOCUMENTS

| | | | |
|---|---|---|---|
| 2004/0067616 A1* | 4/2004 | Hachisuka et al. | 438/241 |
| 2005/0023145 A1* | 2/2005 | Cohen et al. | 205/118 |
| 2005/0029109 A1* | 2/2005 | Zhang et al. | 205/118 |
| 2005/0029660 A1* | 2/2005 | Ruttkowski et al. | 257/753 |
| 2005/0253268 A1* | 11/2005 | Hsu et al. | 257/758 |

OTHER PUBLICATIONS

Hong et al. "Growth of H:Amorpous Si on patterned substrates for increased mechanical stability" 1994 MRS Fall Meeting.*

* cited by examiner

FIG. 3A
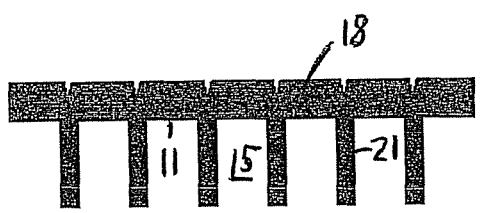
FIG. 4A
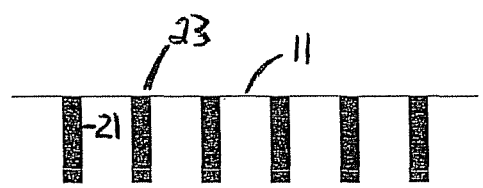
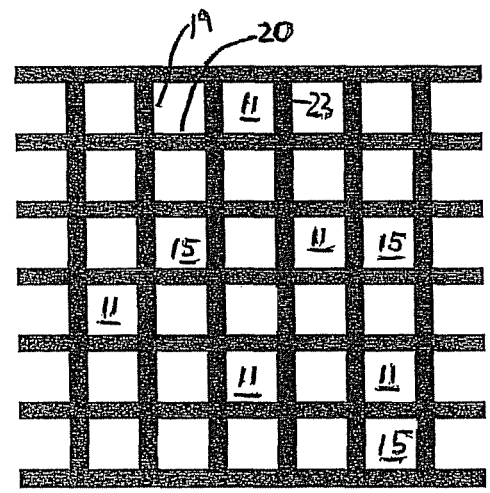
FIG 4B

DELAMINATION RESISTANT SEMICONDUCTOR FILM AND METHOD FOR FORMING THE SAME

FIELD OF THE INVENTION

The present invention relates most generally to the prevention of delamination of deposited films such as used in semiconductor manufacturing and solar cells.

BACKGROUND

Film delamination due to subsequent thermal processing is a problem that plagues the semiconductor manufacturing industry and other applications in which film deposition is utilized. Commonly, the problem is due to a poor adhesion force between the deposited film and the material upon which the film is deposited. This problem can occur when the film is the same as the material upon which it is being deposited or different than the subjacent material. The poor adhesion between the film and the material upon which it is deposited, causes delamination such as peeling, cracking and/or blistering of the film during subsequent thermal processing such that takes place at an elevated temperature in the vicinity of 300° C. or greater. For example, this phenomena is experienced when a stack of amorphous silicon films are formed. Amorphous silicon (a-Si) films may be hydrogenated to passivate dangling bonds and the hydrogenated amorphous silicon is designated a-Si:H. The aforementioned adhesion force is particularly weak at the a-Si:H/a-Si:H interface formed between two films. The upper a-Si layer will delaminate after a subsequent thermal cycle due to residual stress (compressive) formed at the interface due to the deposition characteristics and conditions of the upper a-Si:H film and also due to hydrogen diffusion at the interface. This problem is particularly egregious when the film is relatively thick, such as 1 micron or greater. The problematic subsequent thermal cycling is difficult to avoid since semiconductor devices typically undergo a number of thermal cycling processes during their manufacture. For example, the formation of a passivating film such as silicon nitride typically takes place at an elevated temperature and for a sufficient time to effectuate delamination.

Although described in conjunction with an a-Si film, the delamination problem occurs in various films used in semiconductor device and solar cell fabrication.

There have been various approaches that address this delamination problem. These efforts include fine-tuning the film deposition conditions to minimize the compressive stress of the deposited film, instituting various cleaning procedures prior to the film deposition process, de-gassing prior to the film deposition process, instituting a sticking layer prior to the film deposition process, and roughening the surface upon which the film will be deposited. The effectiveness of these conventional procedures is limited and many of the aforementioned procedures for addressing the problem, are unsuitable for various manufacturing environments.

Even when only partial delamination occurs, contamination from the cracking, peeling, blistering delaminated film degrades the quality of the entire semiconductor device, even in areas where the film does not delaminate. It would therefore be advantageous to provide a process and structure for preventing film delamination during subsequent thermal processing operations.

SUMMARY OF THE INVENTION

To address these and other needs, and in view of its purposes, the present invention provides a method for preventing delamination of a deposited film. The method includes providing a substructure with a first material thereon, depositing a thick film having a thickness of at least 1 micron, on the first material, then partitioning the thick film into a plurality of discrete portions prior to a subsequent thermal treatment, wherein the thick film does not delaminate during the subsequent thermal treatment.

The film may be uniformly partitioned into discrete portions that are regularly arranged and spaced, include a pattern density of at least 80% and are not individually functioning elements of a semiconductor device.

According to another aspect to the invention, provided is a solar cell formed on a substrate and including a film stack thereon. The film stack includes a subjacent amorphous silicon material and a superjacent amorphous silicon film disposed directly on the subjacent amorphous silicon material. The superjacent amorphous silicon film includes a thickness of at least 1.5 microns and is patterned into a plurality of discrete portions. The portions are regularly arranged and spaced and include a pattern density of at least 90 percent. The discrete portions are not separately functioning elements of the solar cell.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 1A, 2A, 3A, and 4A are cross-sectional views showing a sequence of processing operations according to one exemplary embodiment of the invention;

FIGS. 1B, 2B, and 4B are top views of the structure formed in corresponding FIGS. 1A, 2A and 4A.

DETAILED DESCRIPTION

The present invention provides a method and structure for preventing delamination of films during subsequent thermal cycling. The invention finds application in various films that are prone to delamination such as thick films, i.e., film having a thickness greater than 1 micron. In one embodiment, the thick films may be used as sacrificial layers in semiconductor devices such as MEMS (microelectromechanical structure). In other exemplary embodiments, the films may be used in other applications in other semiconductor devices. In one particular exemplary embodiment, the films may be used in solar cells devices formed on semiconductor substrates.

Figure 1A:
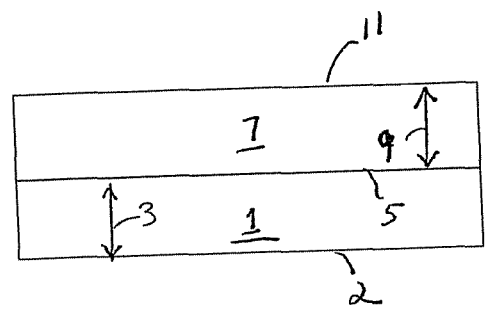
Figure 1B:
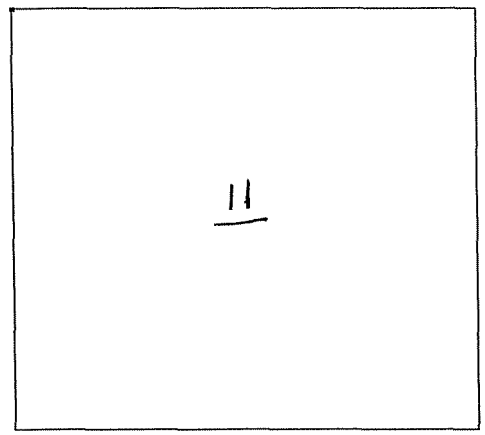

FIGS. 1A and 1B respectively show corresponding cross sectional and top views of a deposited film that, according to the invention, is resistant to delamination. Film 7 is formed on lower material 1. Lower material 1 may be a film having a thickness 3 that may range from an absolutely nominal thickness to a thickness 3 in the range of about 1.5 microns. According to the exemplary embodiment in which lower material 1 is a film, the film includes bottom surface 2 which may be formed on or over various substrates such as used in solar cell and other semiconductor device manufacturing. In another exemplary embodiment, lower material 1 may be a substrate. Lower material 1 includes upper surface 5. Film 7 is formed over lower material 1 and includes thickness 9 of about 1.0 microns or greater although film 7 is most prone to delamination when thickness 9 is greater. In one exemplary embodiment, thickness 9 may be about 4 microns or greater but other thicknesses may be used in other exemplary embodiments. Film 7 may be a permanent, structural film or it may be a sacrificial layer such as used in an MEMS device. Film 7 includes top surface 11. In one exemplary embodiment, film 7 may be amorphous silicon, and in one exemplary embodiment may be a-Si:H but film 7 may be formed of any of various different materials. In yet another exemplary embodiment, such as in a solar cell, each of film 7 and lower material 1 may be amorphous silicon or a-Si:H. Film 7 may be the same as lower material 1 or it may differ in various exemplary embodiments. Film 7 may be formed using various conventional formation methods such as chemical vapor deposition, CVD, which includes PECVD, plasma enhanced chemical vapor deposition and LPCVD, low pressure chemical vapor deposition. According to conventional methods, film 7 may be formed to include a compressive stress that results in a residual stress at the interface between film 7 and lower material 1. In addition to the aforementioned deposition techniques, film 7 may be formed using other deposition techniques and the invention finds particular application in embodiments in which film 7 is formed to include a compressive film stress.

Figure 2A:
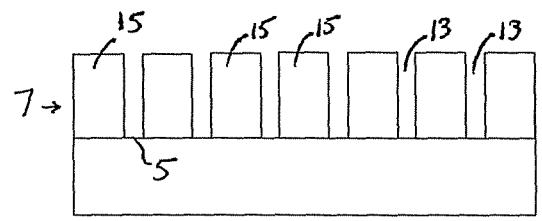
Figure 2B:
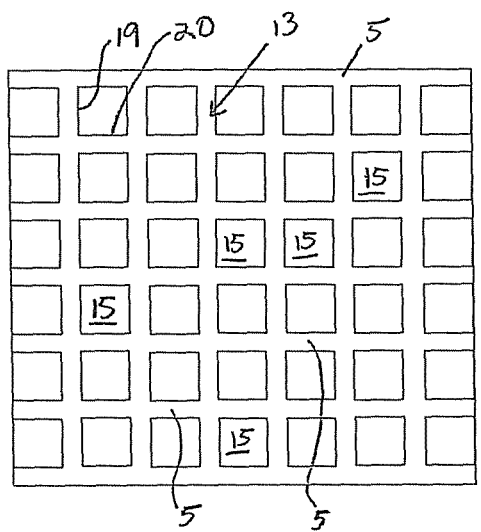

After film 7 is formed, it is partitioned into a plurality of discrete portions such as shown in FIGS. 2A and 2B, each of which illustrate discrete portions 15 separated by separating portions 13. Conventional photolithography and etching techniques may be used to form discrete sections 15. In the illustrated embodiment, film 7 is completely etched though exposing top surface 5 of lower material 1 but in other exemplary embodiments, film 7 need not be completely etched and separating sections 13 may include a thickness of film 7 over top surface 5 of lower material 1.

FIG. 2B shows a plurality of squares, but it should be understood that in other exemplary embodiments, discrete portions 15 may be diamond-shaped, other rectangular shapes, parallelograms, trapezoids, or they may be round, oval or elliptical in other exemplary embodiments. In still other exemplary embodiments, discrete portions 15 may have irregular shapes. Discrete portions 15 may be the same size and shape throughout, such as shown in FIG. 2B or they may be differently shaped, differently sized, or both. Discrete portions 15 may be uniformly separated by a uniform spacing as in the illustrated embodiment, or they may separated by non-uniform separating portions 13. In one embodiment, the discrete portions 15 are regularly arranged and spaced. The individual discrete portions are not individually functioning elements of a semiconductor device; rather, they include a high pattern density and essentially form a film divided into tightly packed sections. In one exemplary embodiment, the pattern density may be 80%-90% or greater. Pattern density represents the percentage of the original film layer still occupied by discrete portions 15, as opposed to spacing portions 13.

For the illustrated embodiment in which discrete sections 15 are rectangles, the orthogonal sides 19 and 20 of each rectangle, may each include a length ranging from about 10 to about 100 microns. The area of each discrete portion 15 may be about 100 to 10000 $\mu m^2$, but other areas may be used in other exemplary embodiments. FIG. 2B also points out that the discrete portions are in close proximity to one another. In the illustrated embodiment, spacing portions 13 include a spacing of about one-third of the width of each discrete portion 15. The spacing, i.e., width of spacing portions 13, may be as low as 1 micron in one exemplary embodiment. In various exemplary embodiments, the spacing may represent 0.1 to 0.01 of the width of the corresponding discrete portion 15. The invention provides for generally forming a plurality of the discrete portions in close proximity and the aggregate area of the discrete portions 15 may be at least four times as great as the aggregate area of the separating portions 13 which represent exposed portions of upper surface 5 in the illustrated embodiment. Other relative dimensions of the discrete portions 15 versus separating portions 13 may be used in other exemplary embodiments. For example, if the spacing is 1 micron and the area of each discrete portion 15 is 10000 $\mu m^2$, the area of the discrete portions will be considerably greater than the area of the separating portions for the various configurations of discrete portions that may be used. It is an aspect and advantage of the invention that a majority of film 7 remains over lower material 5 after film 7 is partitioned. Alternatively stated, film 7 still retains its structural integrity on a global basis after partitioning.

After film 7 is partitioned such as shown in FIG. 2B, the structure is resistant to delamination during subsequent thermal cycling operations. After the structure in FIG. 2B is formed, various thermal cycling operations may take place such as thermal operations that take place at temperatures of 400° C. or greater and for a time of 3 minutes or longer. The thermal cycling operations may be thermal treatments such as annealing or other diffusion operations that are used to condition all or portions of the substructure. Other heating operations including heating operations with considerably longer times and higher temperatures, may be used in other exemplary embodiments. In still other exemplary embodiments, the subsequent thermal operation may be the deposition of a further film over film 7 and lower material 1.

FIG. 3A shows further film 18 formed over film 7 and including plugs 21 that fill separating sections 13 that were shown in FIGS. 2A and 2B. In one exemplary embodiment, further film 18 may be a SiN film. Further film 18 may be the same material or a different material than film 7. Various film deposition techniques may be used to form further film 18 and the thermal conditions may include a temperature of at least 400° C. and for a deposition time of at least 3 minutes. Higher deposition temperatures and longer processing times may be used in other exemplary embodiments. According to the exemplary embodiment in which further film 18 is SiN, the film may include a thickness of about 4500 angstroms and may be formed at a deposition temperature of about 400° C. Other film thicknesses may be used in other exemplary embodiments. An aspect of the invention is that, during the subsequent thermal cycling operation such as the deposition of further film 18, Applicants have found that the delamination of film 7 is prevented due to the partitioning of film 7 into discrete portions 15. According to the embodiment in which further film 18 is a SiN film, the SiN film may be a passivation layer. In other exemplary embodiments such as when film 11 and lower material 1 form a solar cell, various other films such as contact layers and electrodes may be formed over the structure.

According to one exemplary embodiment such as shown in FIGS. 4A and 4B, a planarization process may follow the formation of further film 18 to produce a planarized surface 23 formed of upper surface 11 of discrete portions 15 and the top surfaces of plug materials 21. FIGS. 4A and 4B show the structure after the planarization process. In one exemplary embodiment, further film 18 and film 7 may be formed of the same material thereby producing, as illustrated in FIGS. 4A and 4B a continuous upper film formed of the same material and which is resistant to delamination.

Figure 5:
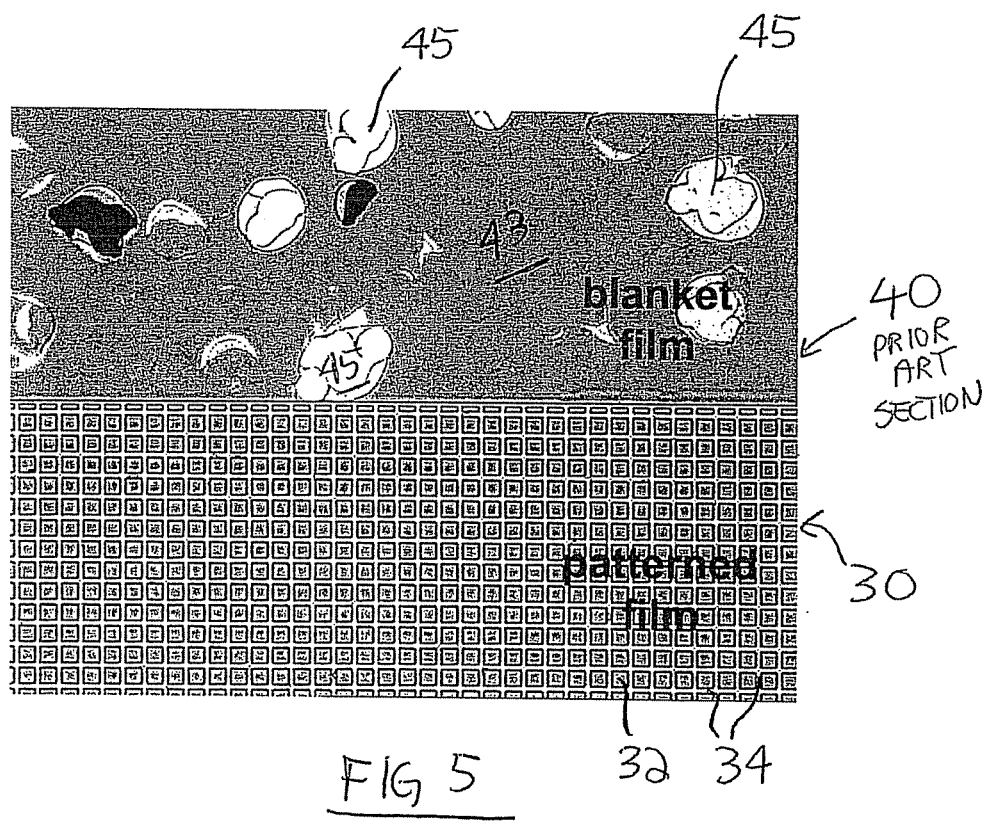
FIG. 5 is a plan view showing portions of the substrate that includes both a blanket film formed according to the prior art and a patterned film according to the invention.

FIG. 5 is a top view that illustrates an example contrasting conventional techniques and the inventive technique performed on the same film formed on a substrate. The same film is formed in sections 30 and 40 of the substrate then, only in section 30, the film is patterned according to the invention to produce discrete portions 32 separated by separating portions 34. Blanket film 43 remains in prior art, conventional section 40. After the film is patterned in section 30, the entire substrate undergoes a thermal processing operation and FIG. 5 illustrates that, in portion 40, delamination occurs at delamination locations 45. The delamination may include blistering, cracking or peeling of the film. The film patterned according to the invention, and which appears in section 30, does not exhibit any delamination.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for preventing delamination of a deposited thick film, said method comprising:
    providing a substructure with a first material thereon, said substructure comprising a substrate, said substrate being one of a semiconductor device substrate and a solar cell substrate;
    depositing a thick film having a thickness of at least 1 micron, on said first material; and
    partitioning said thick film into a plurality of discrete portions; after said partitioning, performing a thermal treatment of said substrate, wherein thereafter said thick film does not delaminate during said thermal treatment,
    wherein said partitioning comprises uniformly partitioning, and said discrete portions are regularly arranged and spaced and said partitioning comprises patterning and completely etching through said thick film thereby exposing said first material;
    and using said thick film as a sacrificial layer.

2. The method as in claim 1, wherein said discrete portions include a pattern density of at least 90%.

3. The method as in claim 1, further comprising using said thick film as a sacrificial layer in a MEMS (microelectromechanical structure) semiconductor device.

4. The method as in claim 1, wherein said discrete portions are separated by separating portions, an area of said plurality of discrete portions being at least three times as great as an area of said separating portions.

5. The method as in claim 1, wherein said thickness is greater than about 4 microns.

6. The method as in claim 1, wherein said discrete portions comprise rectangles, each having orthogonal lengths of between 10 microns and 100 microns.

7. The method as in claim 1, wherein said discrete portions are substantially the same size and same shape, said shape comprising one of a diamond-shape, a square, a triangle, a trapezoid, a parallelogram, and an ellipse.

8. The method as in claim 1, wherein said depositing comprises one of chemical vapor deposition, LPCVD (low pressure chemical vapor deposition) and PECVD (plasma enhanced chemical vapor deposition).

9. A method for preventing delamination of a deposited thick film, said method comprising:
    providing a substructure with a first material thereon, said substructure comprising a substrate, said substrate being one of a semiconductor device substrate and a solar cell substrate;
    depositing a thick film having a thickness of at least 1 micron, on said first material; and
    partitioning said thick film into a plurality of discrete portions; after said partitioning, performing a thermal treatment of said substrate, wherein thereafter said thick film does not delaminate during said thermal treatment,
    wherein said partitioning comprises uniformly partitioning, and said discrete portions are regularly arranged and spaced and said thick film comprises amorphous silicon;
    and using said thick film as a sacrificial layer.

10. The method as in claim 9, wherein said first material comprises amorphous silicon.

11. The method as in claim 1, wherein said thermal treatment includes a temperature of at least 400° C. and a time of at least three minutes.

12. A method for preventing delamination of a deposited thick film, said method comprising:
    providing a substructure with a first material thereon, said substructure comprising a substrate, said substrate being one of a semiconductor device substrate and a solar cell substrate;
    depositing a thick film having a thickness of at least 1 micron, on said first material;
    partitioning said thick film into a plurality of discrete portions; after said partitioning, performing a thermal treatment of said substrate, wherein thereafter said thick film does not delaminate during said thermal treatment,
    wherein said partitioning comprises uniformly partitioning, and said discrete portions are regularly arranged and spaced; and
    depositing a further film over said thick film and in spaces between said plurality of discrete portions wherein said thick film and said further film are formed of the same material and further comprising planarizinq said further film;
    and using said thick film as a sacrificial layer.

13. The method as in claim 12, wherein said further film comprises a silicon nitride film.

* * * * *